(12) United States Patent
Matsumoto et al.

(10) Patent No.: US 10,519,549 B2
(45) Date of Patent: Dec. 31, 2019

(54) APPARATUS FOR PLASMA ATOMIC LAYER DEPOSITION

(71) Applicant: THE JAPAN STEEL WORKS, LTD., Shinagawa-ku, Tokyo (JP)

(72) Inventors: Tatsuya Matsumoto, Kanagawa (JP); Keisuke Washio, Kanagawa (JP)

(73) Assignee: THE JAPAN STEEL WORKS, LTD., Tokyo (JP)

( * ) Notice: Subject to any disclaimer, the term of this patent is extended or adjusted under 35 U.S.C. 154(b) by 222 days.

(21) Appl. No.: 15/575,360

(22) PCT Filed: Apr. 19, 2016

(86) PCT No.: PCT/JP2016/062402
§ 371 (c)(1),
(2) Date: Nov. 18, 2017

(87) PCT Pub. No.: WO2016/190007
PCT Pub. Date: Dec. 1, 2016

(65) Prior Publication Data
US 2018/0148842 A1    May 31, 2018

(30) Foreign Application Priority Data

May 26, 2015 (JP) ................................. 2015-106858

(51) Int. Cl.
*C23C 16/40* (2006.01)
*C23C 16/50* (2006.01)
(Continued)

(52) U.S. Cl.
CPC .......... *C23C 16/50* (2013.01); *C23C 16/4412* (2013.01); *C23C 16/45544* (2013.01); *C23C 16/45565* (2013.01)

(58) Field of Classification Search
CPC ................ C23C 16/50; C23C 16/4412; C23C 16/45565; C23C 16/45544;
(Continued)

(56) References Cited

U.S. PATENT DOCUMENTS 4,793,283 A * 12/1988 Sarkozy ............... C23C 16/4412
118/715
5,044,314 A *  9/1991 McNeilly .......... H01L 21/31116
118/500
(Continued)

FOREIGN PATENT DOCUMENTS

CN      101356630 A    1/2009
JP       61163279 A    7/1986
(Continued)

OTHER PUBLICATIONS

English translation of the International Preliminary Report on Patentability dated Dec. 7, 2017 issued in counterpart International Application No. PCT/JP2016/062402.
(Continued)

Primary Examiner — Rudy Zervigon
(74) Attorney, Agent, or Firm — Holtz, Holtz & Volek PC

(57) ABSTRACT

An apparatus for plasma atomic layer deposition includes a tubular, insulating injector adhesion preventive member mountable to a gas-introducing opening section from inside a film forming chamber, a tubular, insulating exhaust adhesion preventive member mountable to an exhaust opening section from inside the film forming chamber, and an insulating film forming chamber adhesion preventive member mountable to an inner wall side of the film forming chamber. The injector adhesion preventive member and the exhaust adhesion preventive member are separated from each of a plate electrode and a counter electrode side, and the film forming chamber adhesion preventive member is disposed on each side of the injector adhesion preventive (Continued)

member and the exhaust adhesion preventive member to be separated from each of the plate electrode and the counter electrode side. The apparatus further includes an upper and lower inert-gas supply port that purges inert gas toward inside the film forming chamber.

13 Claims, 7 Drawing Sheets

(51) Int. Cl.
 *C23C 16/44* (2006.01)
 *C23C 16/455* (2006.01)
(58) Field of Classification Search
 CPC .............. C23C 16/4401; C23C 16/308; C23C 16/45563; C23C 16/45536; H01J 37/32834; H01J 37/32486; H01J 37/32477; H01J 37/3244; H01J 37/3288
 USPC ..... 118/723 E, 723 ER; 156/345.43, 345.44, 156/345.45, 345.46, 345.47
 See application file for complete search history.

(56) References Cited

U.S. PATENT DOCUMENTS

| | | | |
|---|---|---|---|
| 5,326,725 A | 7/1994 | Sherstinsky et al. | |
| 5,772,770 A * | 6/1998 | Suda | C23C 16/4401 118/719 |
| 5,788,799 A * | 8/1998 | Steger | B08B 7/0042 134/1.1 |
| 5,972,116 A | 10/1999 | Takagi | |
| 5,997,651 A | 12/1999 | Matsuse et al. | |
| 6,194,037 B1* | 2/2001 | Terasaki | C23C 16/402 427/569 |
| 6,248,672 B1 | 6/2001 | Takagi | |
| 6,527,911 B1* | 3/2003 | Yen | H01J 37/32568 118/723 E |
| 6,733,593 B1 | 5/2004 | Tanaka et al. | |
| 8,430,960 B2* | 4/2013 | Sumakeris | C23C 16/4401 118/715 |
| 9,777,371 B2* | 10/2017 | Coutu | C23C 16/4401 |
| 2002/0122885 A1* | 9/2002 | Ahn | C23C 16/45525 427/255.28 |
| 2002/0182876 A1* | 12/2002 | Kawai | H01J 37/32477 438/706 |
| 2003/0150560 A1* | 8/2003 | Kinnard | C23C 16/455 156/345.33 |
| 2003/0207032 A1* | 11/2003 | Ahn | C23C 16/4412 427/255.34 |
| 2003/0213560 A1* | 11/2003 | Wang | C23C 14/566 156/345.31 |
| 2006/0185590 A1* | 8/2006 | Schaepkens | C23C 16/342 118/715 |
| 2006/0280868 A1 | 12/2006 | Kato et al. | |
| 2007/0051312 A1* | 3/2007 | Sneh | C23C 14/566 118/719 |
| 2008/0261074 A1* | 10/2008 | Shishikura | B24C 1/06 428/687 |
| 2009/0277389 A1 | 11/2009 | Kakimoto | |
| 2010/0047447 A1* | 2/2010 | Cook | C23C 16/45563 427/248.1 |
| 2010/0210092 A1* | 8/2010 | You | C23C 16/24 438/478 |
| 2010/0298738 A1* | 11/2010 | Felts | B05D 1/62 600/576 |
| 2011/0174441 A1* | 7/2011 | Yamashita | C23C 16/4404 156/345.38 |
| 2011/0303147 A1 | 12/2011 | Tachibana et al. | |
| 2011/0305836 A1 | 12/2011 | Murata et al. | |
| 2012/0031748 A1 | 2/2012 | Ishihara | |
| 2012/0064245 A1* | 3/2012 | Coutu | C23C 16/4401 427/248.1 |
| 2014/0008352 A1* | 1/2014 | Uemura | H01J 37/32724 219/601 |
| 2016/0148801 A1* | 5/2016 | Yabe | C23C 16/402 438/778 |
| 2018/0315626 A1* | 11/2018 | Franklin | H01L 21/67103 |

FOREIGN PATENT DOCUMENTS

| | | |
|---|---|---|
| JP | 63076880 A | 4/1988 |
| JP | 01183113 A | 7/1989 |
| JP | 06140379 A | 5/1994 |
| JP | 07201754 A | 8/1995 |
| JP | 08186081 A | 7/1996 |
| JP | 09115993 A | 5/1997 |
| JP | 11335849 A | 12/1999 |
| JP | 2000208439 A | 7/2000 |
| JP | 2000243711 A | 9/2000 |
| JP | 2002302770 A | 10/2002 |
| JP | 2003068657 A | 3/2003 |
| JP | 2004339581 A | 12/2004 |
| JP | 2006080148 A | 3/2006 |
| JP | 2006351655 A | 12/2006 |
| JP | 2007281150 A | 10/2007 |
| JP | 2009062579 A | 3/2009 |
| JP | 2010212433 A | 9/2010 |
| JP | 2010212434 A | 9/2010 |
| JP | 2010212434 A * | 9/2010 ....... C23C 16/45544 |
| JP | 2012052221 A | 3/2012 |
| JP | 2012126977 A | 7/2012 |
| JP | 2012175055 A | 9/2012 |
| JP | 2014192379 A | 10/2014 |
| JP | 2015073019 A | 4/2015 |
| JP | 2015073020 A | 4/2015 |
| JP | 2015073021 A | 4/2015 |
| KR | 1020080098687 A | 11/2008 |
| KR | 101028605 B1 | 4/2011 |
| TW | 457524 B | 10/2001 |
| WO | 0042235 A1 | 7/2000 |
| WO | 2007116940 A1 | 10/2007 |

OTHER PUBLICATIONS

Related U.S. Appl. No. 15/575,357; First Named Inventor: Tatsuya Matsumoto; Title: "Device for Atomic Layer Deposition"; filed: Nov. 18, 2017.
Related U.S. Appl. No. 15/575,358; First Named Inventor: Tatsuya Matsumoto; Title: "Device for Atomic Layer Deposition"; filed: Nov. 18, 2017.
Related U.S. Appl. No. 15/575,359; First Named Inventor: Tatsuya Matsumoto; Title: "Atomic Layer Growth Device and Atomic Layer Growth Device Exhaust Unit"; filed: Nov. 18, 2017.
International Search Report (ISR) and Written Opinion dated Aug. 2, 2016 issued in International Application No. PCT/JP2016/062402.

* cited by examiner

APPARATUS FOR PLASMA ATOMIC LAYER DEPOSITION

TECHNICAL FIELD

The present invention relates to an apparatus for plasma atomic layer deposition for forming a thin film on a substrate.

BACKGROUND ART

The atomic layer deposition method, in which gases of elements constituting a thin film to be formed are alternately supplied onto a substrate to form a thin film in units of atomic layers on the substrate, is known as a technique for uniformly forming a thin film. Compared with a common CVD (Chemical Vapor Deposition) method, the atomic layer deposition method excels in step covering property and film thickness controllability.

Repeating the formation of a thin film by the atomic layer deposition method will lead to adhesion of the thin film even on an inner surface of a film forming chamber. As the thickness of the thin film adhered to the inner surface of the film forming chamber increases, the deposited thin film will be peeled off and part of the thin film becomes particles, causing deterioration of the quality of the thin film formed on the substrate. For that reason, it is preferable to remove the thin film deposited on the inner surface of the film forming chamber at regular intervals.

Patent Literature 1 proposes a processing method and apparatus in which an anti-adhesion plate is used and besides deposits deposited on the inner wall of a chamber are covered with an amorphous film in a vapor-phase growing apparatus for CVD film forming, sputter film forming, and the like. Although it is possible to reduce the frequency of cleaning by such means in a conventional vapor-phase growing apparatus, when the thickness of the deposits deposited on the inner wall of the chamber and the amorphous film covering the deposits becomes not less than a predetermined thickness, it is necessary to perform cleaning by using a wet etching method. However, in the wet etching method, since the film forming chamber is opened up, the time and effort for the opening work increases as the size of the film forming chamber increases, and therefore, when a gas etching method can be used, it is preferable to use the gas etching method. To perform etching by the gas etching method, while it is necessary to heat a portion of the inner wall surface of the film forming chamber, onto which a thin film has adhered, to a temperature not less than a predetermined temperature, a portion apart from the heater may not reach a necessary heating temperature, making it difficult to perform gas etching. For that reason, if a certain amount of thin film has adhered to a location where it is difficult to perform gas etching, it becomes necessary to open up the film forming chamber and perform wet etching.

There is proposed a technique for inserting an anti-adhesion plate in a film forming chamber for the purpose of increasing the interval of wet etching, and further suppressing film adhesion to the film forming chamber body (Patent Literature 2). In a conventional scheme, the anti-adhesion plate is divided to be placed in the film forming chamber. Dividing the anti-adhesion plate makes the handling thereof easy, and further, in the case of an apparatus for heating to higher temperatures, it becomes possible to absorb thermal expansion of the anti-adhesion plate by providing space in gaps between divided anti-adhesion plates.

However, in an apparatus for atomic layer deposition, a raw material gas and a reaction gas will readily infiltrate into fine gaps, forming films. Gases that have filtrated into such fine gaps turn into film and powder, thus causing particles. Therefore, in an apparatus for atomic layer deposition, it is preferable to suppress the dividing of the anti-adhesion plate as much as possible.

To suppress film adhesion in a case in which the dividing of anti-adhesion plate is needed, it is possible to employ a method of supplying inert gas as shown, for example, in Patent Literature 3.

Moreover, in an atomic layer deposition without use of plasma, it is possible to protect an upper part of the substrate by employing the anti-adhesion plate shown in Patent Literature 4. On the other hand, in a parallel-plate type plasma apparatus, in which an electrode for applying high-frequency voltage to an upper section of the substrate is placed, an insulator is used for supporting the electrode to which high-frequency voltage is applied. For this insulator, mainly, resins such as Teflon (registered trademark), and ceramics are used.

CITATION LIST

Patent Literature

[Patent Literature 1] Japanese Patent Laid-Open No. 2006-351655
[Patent Literature 2] Japanese Patent Laid-Open No. 2009-62579
[Patent Literature 3] Japanese Patent Laid-Open No. 2012-52221
[Patent Literature 4] Japanese Patent Laid-Open No. 2012-126977

SUMMARY OF INVENTION

Technical Problem

However, although an insulating support which fixes an upper electrode can be reproduced by wet etching, there is a risk that as a result of disassembling the support and reconstructing the plate electrode, the mounting position of the plate electrode is shifted from a previous mounting position, and thereby the plasma condition is changed from that before maintenance. Therefore, it is not preferable to perform maintenance of the insulating support, and the insulating support is preferably maintenance free.

Accordingly, it is conceivable to utilize an insulating anti-adhesion plate for the insulating support. In that occasion, the insulating anti-adhesion plate is fixed by fixing means such as a screw. However, since film adhesion readily occurs even in a screw hole in atomic layer deposition, the screw is firmly fixed by the force of film. Therefore, once film adhesion occurs, large force is required to remove the screw, and in such an occasion, the screw and the anti-adhesion plate are likely to be broken if they are made of a ceramic. Since resins may possibly be deformed, they are difficult to use.

Thus, since the maintenance of the insulating support becomes also complicated when an anti-adhesion plate is used, it is preferable to suppress any possible film adhesion on this portion.

It is an objective of the present invention to provide an apparatus for plasma atomic layer deposition which is capable of reducing the frequency of cleaning the film forming chamber and adhesion preventive members within the film forming chamber, and reducing the number of maintenance parts, thus improving maintenance workability.

Solution to Problem

That is, a first embodiment of the apparatus for plasma atomic layer deposition of the present invention is an apparatus for plasma atomic layer deposition for forming a thin film on a substrate, comprising:

a film forming chamber;

a plate electrode provided so as to face a substrate retained in the film forming chamber;

a counter electrode retaining the substrate within the film forming chamber;

a gas-introducing opening section provided in one side wall section of the film forming chamber; and an exhaust opening section provided in the other side wall section, which faces the one side wall section, of the film forming chamber, wherein the apparatus for plasma atomic layer deposition further comprises:

an insulating injector adhesion preventive member which is mountable to the gas-introducing opening section from inside the film forming chamber, and is disposed in a tubular shape so as to surround an opening of the gas-introducing opening section;

an insulating exhaust adhesion preventive member which is mountable to the exhaust opening section from inside the film forming chamber, and is disposed in a tubular shape so as to surround an opening of the exhaust opening section; and an insulating film forming chamber adhesion preventive member which is mountable to an inner wall side of the film forming chamber, wherein the injector adhesion preventive member is separated from each of the plate electrode and the counter electrode side by a gap, and is configured such that its tip end is located inside with reference to the plate electrode end on the gas-introducing opening section side, the exhaust adhesion preventive member is separated from each of the plate electrode and the counter electrode side by a gap, and is configured such that its tip end is located inside with reference to the plate electrode end on the exhaust opening section side, and the film forming chamber adhesion preventive member is located at least on each side of the injector adhesion preventive member and the exhaust adhesion preventive member and to be separated from each of the plate electrode and the counter electrode side by a gap; and the apparatus for plasma atomic layer deposition further comprises an upper inert-gas supply port that purges inert gas toward inside the film forming chamber from the gap between the plate electrode, and each of the injector adhesion preventive member, the exhaust adhesion preventive member, and the film forming chamber adhesion preventive member;

a lower inert-gas supply port that purges inert gas toward inside the film forming chamber from the gap between the counter electrode, and each of the injector adhesion preventive member, the exhaust adhesion preventive member, and the film forming chamber adhesion preventive member;

an upper inert-gas supply section to be connected to the upper inert-gas supply port; and a lower inert-gas supply section to be connected to the lower inert-gas supply port.

Invention of the apparatus for plasma atomic layer deposition of another embodiment is the present invention of the above described embodiment, in which the injector adhesion preventive member extends such that its tip end position is located in a range of not less than 0.1 mm to not more than 200 mm from the plate electrode end toward the plate electrode center, with reference to the plate electrode end on the gas-introducing opening section side, and the exhaust adhesion preventive member extends such that its tip end position is located in a range of not less than 0.1 mm to not more than 200 mm from the plate electrode end toward the plate electrode center, with reference to the plate electrode end on the exhaust opening section side.

Invention of the apparatus for plasma atomic layer deposition of another embodiment is the present invention of the above described embodiment, in which a side end section of a tubular opening section by the injector adhesion preventive member has a distance of not less than 0.1 mm and not more than 200 mm outwardly from the end section on the sideward side of the substrate retained by the counter electrode, and a side end section of a tubular opening section by the exhaust adhesion preventive member has a distance of not less than 0.1 mm and not more than 200 mm outwardly from the end section on the sideward side of the substrate retained by the counter electrode.

Invention of the apparatus for plasma atomic layer deposition of another embodiment is the present invention of the above described embodiment, in which the film forming chamber adhesion preventive member has a size to cover a vertical width of a side section of the injector adhesion preventive member and a side section of the exhaust adhesion preventive member, and an inner side surface of the film forming chamber adhesion preventive member and an outer side surface of the injector adhesion preventive member have a gap of not less than 0.1 mm and not more than 20 mm in horizontal distance therebetween, and an inner side surface of the film forming chamber adhesion preventive member and an outer side surface of the exhaust adhesion preventive member have a gap of not less than 0.1 mm and not more than 20 mm in horizontal distance therebetween.

Invention of the apparatus for plasma atomic layer deposition of another embodiment is the present invention of the above described embodiment, in which the film forming chamber adhesion preventive member and the injector adhesion preventive member have an overlap of not less than 0.1 mm and not more than 200 mm in a flow direction of gas between the gas-introducing opening section and the exhaust opening section, and the film forming chamber adhesion preventive member and the exhaust adhesion preventive member have an overlap of not less than 0.1 mm and not more than 200 mm in a flow direction of gas between the gas-introducing opening section and the exhaust opening section.

Invention of the apparatus for plasma atomic layer deposition of another embodiment is the present invention of the above described embodiment, in which the injector adhesion preventive member is configured such that its sideward outer surface is located inside at a distance of not less than 0.1 mm and not more than 200 mm with reference to a side end of the plate electrode, and the exhaust adhesion preventive member is configured such that its sideward outer surface is located inside at a distance of not less than 0.1 mm and not more than 200 mm with reference to a side end of the plate electrode end.

Invention of the apparatus for plasma atomic layer deposition of another embodiment is the present invention of the above described embodiment, in which the film forming chamber adhesion preventive member, the injector adhesion preventive member, and the exhaust adhesion preventive member are mounted and fixed to the film forming chamber so as to each have a fixing end section against the film forming chamber at a position of a distance of not less than 50 mm apart from a proximal plate electrode end.

Invention of the apparatus for plasma atomic layer deposition of another embodiment is the present invention of the above described embodiment, in which the film forming chamber adhesion preventive member has a length extending over the injector adhesion preventive member and the exhaust adhesion preventive member.

Invention of the apparatus for plasma atomic layer deposition of another embodiment is the present invention of the above described embodiment, in which the upper inert-gas supply section and the lower inert-gas supply section are respectively connected to the upper inert-gas supply port and the lower inert-gas supply port by a shower head structure.

Invention of the apparatus for plasma atomic layer deposition of another embodiment is the present invention of the above described embodiment, in which each of an upper surface of the injector adhesion preventive member and an upper surface of the exhaust adhesion preventive member is separated from a lower surface of the plate electrode side by a gap of not less than 0.1 mm and not more than 20 mm in vertical distance.

Invention of the apparatus for plasma atomic layer deposition of another embodiment is the present invention of the above described embodiment, in which each of the injector adhesion preventive member and the exhaust adhesion preventive member is separated from a proximal end section of the substrate retained by the counter electrode by a gap of not less than 0.1 mm and not more than 200 mm in horizontal distance, in a flow direction of gas between the gas introducing section and the exhaust section.

Invention of the apparatus for plasma atomic layer deposition of another embodiment is the present invention of the above described embodiment, in which each of a lower surface of the injector adhesion preventive member and a lower surface of the exhaust adhesion preventive member is separated from an upper surface of the counter electrode side by a gap of not less than 0.1 mm and not more than 20 mm in vertical distance.

Invention of the apparatus for plasma atomic layer deposition of another embodiment is the present invention of the above described embodiment, in which the counter electrode includes a counter electrode retaining section which has a retaining surface for retaining the substrate, and a counter-electrode peripheral edge section which is present around the counter electrode retaining section, and has a height lower than that of the counter electrode retaining surface.

Advantageous Effects of Invention

According to the present invention, the area of film adhesion within the film forming chamber can be reduced, thereby making it possible to suppress generation of particles and to reduce the frequency of cleaning the film forming chamber and the adhesion preventive member.

DESCRIPTION OF EMBODIMENT

First, referring to the appended drawings, the configuration of an apparatus for plasma atomic layer deposition 10 of the present embodiment will be described.

Figure 1:
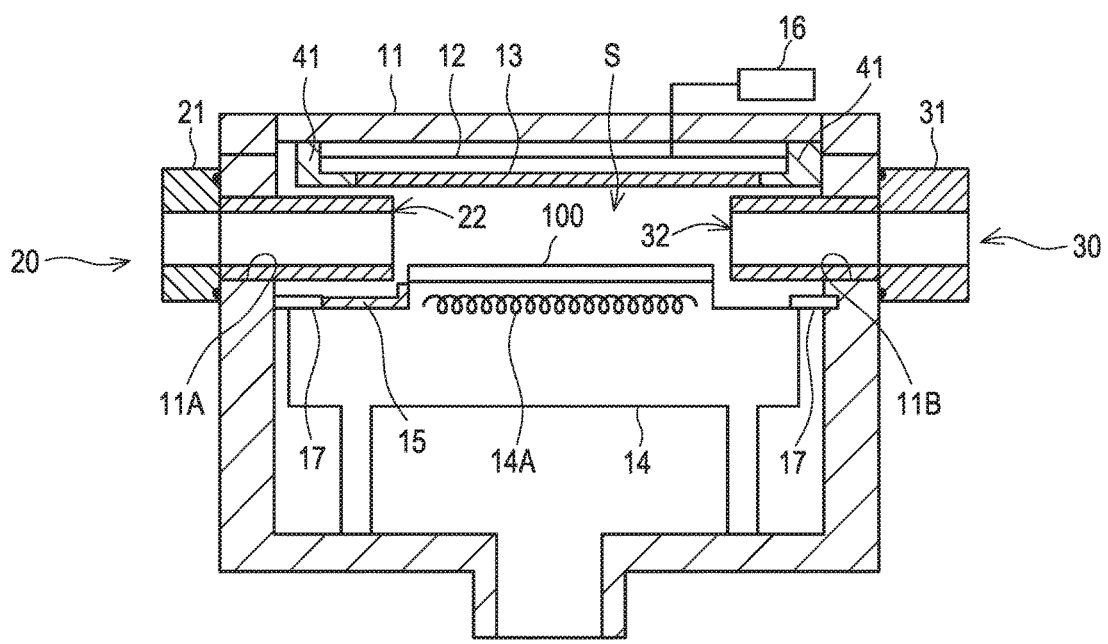
FIG. 1 is a schematic block diagram showing an apparatus for plasma atomic layer deposition of one embodiment of the present invention.

FIG. 1 is a schematic block diagram showing one example of the apparatus for plasma atomic layer deposition of the present embodiment.

The apparatus for plasma atomic layer deposition 10 of the present embodiment alternately supplies a raw material gas and a reaction gas to form a thin film in units of atomic layers on a substrate 100. In that occasion, to improve the reaction activity, the substrate 100 can be heated. In the present embodiment, TMA (Tri-Methyl Aluminum) is used as the raw material gas, and in that occasion, plasma is generated to improve reaction activity. In the present embodiment, a parallel plate electrode is used to generate plasma.

The film forming chamber 11 includes an injector 21, an exhaust flange 31, a plate electrode 12, a counter electrode 14, and a high-frequency power supply 16. The counter electrode 14 includes a stage heater 14A, and can adjust the temperature of the substrate 100. For example, in the case of the apparatus for plasma atomic layer deposition, the substrate 100 is heated to 50 to 200° C. When carrying out the processing, the film forming chamber 11 is maintained in vacuum.

The plate electrode 12 is provided above the substrate 100 separated by a film forming space S, and is supported by an insulating support 41. A surface exposed from the insulating support 41 functions as the plate electrode 12, and an end of the exposed surface corresponds to the end section of the plate electrode 12. A conductive, plate-shaped plate electrode adhesion preventive member 13 is provided on the side of the lower surface where the plate electrode 12 is exposed, and the lower surface of the plate electrode adhesion preventive member 13 and the lower surface of the insulating support 41 are made flush with each other.

Moreover, the counter electrode 14 includes, around a counter-electrode retaining section 14B having a retaining surface for retaining the substrate 100, a counter-electrode peripheral edge section 14C whose height is made smaller than that of the retaining surface, and is retained to the film forming chamber 11 by a stage stopper 17 at the counter-electrode peripheral edge section 14C. Further, a plate-shaped counter electrode adhesion preventive member 15 is provided on an upper surface of the counter-electrode peripheral edge section 14C and a vertical surface of the border with the retaining surface.

By the high-frequency power supply 16 supplying high-frequency current of a predetermined frequency to the plate electrode 12, plasma is generated between the plate electrode 12 and the counter electrode 14.

Next, the gas introducing section 20 through which a raw material gas, a reaction gas, and a purge gas are introduced will be described. The gas introducing section 20 supplies the raw material gas, reaction gas, and purge gas into the film forming chamber 11 according to a processing procedure. The injector 21 is mounted to the gas-introducing opening section 11A of the film forming chamber 11, and the injector adhesion preventive member 22 is inserted into the gas-introducing opening section 11A from inside the film forming chamber 11 and mounted thereto so as to surround the opening of the gas-introducing opening section 11A. The injector adhesion preventive member may have any configuration such as to surround the opening by being inserted thereto, surround it from outside, or combination thereof.

Note that, in this example, the gas-introducing opening section 11A is formed into a rectangular-hole shape, and the injector adhesion preventive member 22 is disposed in a rectangular-tube shape so as to surround the gas-introducing opening section 11A. The injector adhesion preventive member 22 may be one which is formed into a tubular shape, or one which is made into a tubular shape by joining multiple members. The injector adhesion preventive member may be any of configurations including one to surround the opening by being inserted into the opening section, one to surround the opening from outside, or combination thereof.

Next, an exhaust section 30 will be described. The exhaust section 30 exhausts the raw material gas, reaction gas, and purge gas from the film forming chamber 11 according to the processing procedure. The exhaust flange 31 is mounted to an exhaust opening section 11B of the film forming chamber 11, and an exhaust adhesion preventive member 32 is inserted into the exhaust opening section 11B from inside the film forming chamber 11, and mounted thereto so as to surround the opening of the exhaust opening section 11B. The exhaust adhesion preventive member may have any configuration including one to be inserted into the opening section to surround the opening, one to surround the opening from outside, and the combination thereof.

Note that, in this example, the exhaust opening section 11B is formed into a rectangular-hole shape, and the exhaust adhesion preventive member 32 is disposed in a rectangular-tube shape so as to surround the exhaust opening section 11B. The exhaust adhesion preventive member 32 may be formed into a tubular shape, or made tubular by joining multiple members. The exhaust adhesion preventive member 32 may be made into a tubular shape conforming to the shape of the exhaust opening section 11B.

The gas introduced into the film forming chamber 11 results in a flow of gas from the gas introducing section 20 toward the exhaust section 30 according to the processing procedure. The following description will be given with supposition that the direction intersecting with this flow of gas be a sideward direction.

Figure 2:
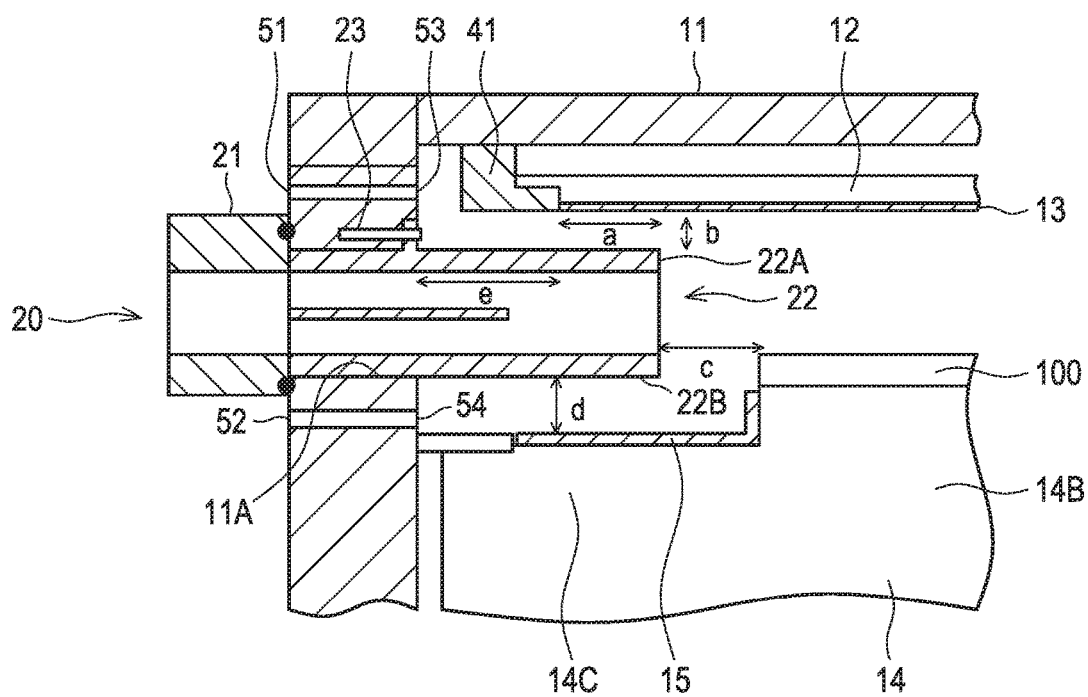
FIG. 2 is likewise an enlarged view of a periphery of gas introducing side seen from a film forming chamber side surface, which is parallel with the direction of gas flow.

FIG. 2 is an enlarged sectional view of a periphery of the gas introducing section 20 when seen from a side surface of the film forming chamber 11, which is parallel with the direction of gas flow from the gas introducing section 20 toward the exhaust section 30.

The injector adhesion preventive member 22 which is an insulator is mounted by being inserted from inside the film forming chamber 11 and is fixed to the film forming chamber 11 with a fixing screw 23.

An injector adhesion preventive member upper plate 22A corresponding to the upper side of the injector adhesion preventive member 22 is separated from the plate electrode adhesion preventive member 13 provided on the plate electrode 12 side by a gap in the vertical direction, and an injector adhesion preventive member lower plate 22B corresponding to the lower side of the injector adhesion preventive member 22 is separated from the counter electrode adhesion preventive member 15 on the counter electrode 14 side by a gap in the vertical direction.

Moreover, a film forming chamber adhesion preventive member 63 is disposed on each side of the injector adhesion preventive member 22 and the exhaust adhesion preventive member 32 to be mounted and fixed to an inner wall of the film forming chamber 11. In this example, it is placed on a projecting wall 64 which projects from the inner wall of the film forming chamber 11, and is fixed to the projecting wall 64 with a fixing screw 65. A film forming chamber adhesion preventive member 63 has an enough size to cover a vertical width of an injector adhesion preventive member side plate 22C of the injector adhesion preventive member 22, and further has a length extending over the injector adhesion preventive member side plate 22C and an exhaust adhesion preventive member side plate 32C.

An inner surface of the film forming chamber adhesion preventive member 63 is separated from an outer surface of the injector adhesion preventive member side plate 22C and an outer surface of the exhaust adhesion preventive member side plate 32C by gaps, and further the film forming chamber adhesion preventive member 63 is separated from the insulating support 41, the plate electrode adhesion preventive member 13, the counter electrode adhesion preventive member 15, and the substrate 100 retained by the counter electrode 14 by gaps.

The space inside the injector adhesion preventive member 22, the exhaust adhesion preventive member 32, and the film forming chamber adhesion preventive member 63 constitutes a film forming space S.

The film forming chamber 11 is connected with an upper inert-gas supply section 51 and a lower inert-gas supply section 52, in which the upper inert-gas supply section 51 is connected to an upper inert-gas supply port 53 provided inside the film forming chamber 11, and the lower inert-gas supply section 52 is connected to a lower inert-gas supply port 54 provided inside the film forming chamber 11. The upper inert-gas supply section 51 and the lower inert-gas supply section 52 can supply inert gas such as nitrogen.

The inert gas ejected from the upper inert-gas supply port 53 is supplied into the film forming chamber 11 through gaps formed by the injector adhesion preventive member upper plate 22A, and the insulating support 41, the plate electrode 12, and the plate electrode adhesion preventive member 13.

Moreover, the inert gas ejected from the upper inert-gas supply port 53 is supplied into the film forming chamber 11 through gaps formed by the exhaust adhesion preventive member upper plate 32A, and the insulating support 41, the plate electrode 12, and the plate electrode adhesion preventive member 13.

Further, the inert gas ejected from the upper inert-gas supply port 53 is supplied to the film forming chamber 11 through gaps formed by the film forming chamber adhesion preventive member 63, and the insulating support 41, the plate electrode 12, and the plate electrode adhesion preventive member 13.

The inert gas ejected from the lower inert-gas supply port 54 is supplied into the film forming chamber 11 through gaps formed by the injector adhesion preventive member lower plate 22B, and the counter electrode 14, the counter electrode adhesion preventive member 15, and the substrate 100 retained by the counter electrode 14.

Moreover, the inert gas ejected from the lower inert-gas supply port 54 is supplied into the film forming chamber 11 through gaps formed by the exhaust adhesion preventive member lower plate 32B, and the counter electrode 14, the counter electrode adhesion preventive member 15, and the substrate 100 retained by the counter electrode 14.

Further, inert gas ejected from the lower inert-gas supply port 54 is supplied to the film forming chamber 11 through gaps formed by the film forming chamber adhesion preventive member 63, and the counter electrode 14, the counter electrode adhesion preventive member 15, and the substrate 100 retained by the counter electrode 14.

Here, the injector adhesion preventive member 22 is preferably configured such that a tip end of the injector adhesion preventive member upper plate 22A is located inside from an end section of the plate electrode 12, and further, extends over a horizontal distance "a" of not less than 0.1 mm and not more than 200 mm in a direction toward the plate electrode center with reference to the end section of the plate electrode 12. A larger value of the horizontal distance "a" makes it possible to suppress the raw material gas and reaction gas from infiltrating to the upper inert-gas supply port 53 side from an outlet of the injector adhesion preventive member 22. However, since a larger value of the horizontal distance "a" causes increase in the size of the film forming chamber 11, an optimum value is needed. In the apparatus for plasma atomic layer deposition of the present invention, an upper limit thereof is preferably 20 mm.

Moreover, as shown in FIG. 2, a lower surface side of the plate electrode 12 and the injector adhesion preventive member upper plate 22A of the injector adhesion preventive member 22 have a gap therebetween, and further, preferably have a vertical distance "b" of not less than 0.1 mm and not more than 20 mm. Note that when the plate electrode adhesion preventive member 13 is used for the plate electrode 12, the vertical distance between the plate electrode adhesion preventive member 13 and the upper surface of the injector adhesion preventive member will be "b".

A smaller value of the vertical distance "b" makes it possible to suppress the raw material gas and reaction gas from infiltrating to the upper inert-gas supply port 53 side. However, an extremely small value of the vertical distance "b" may cause interference between the injector adhesion preventive member 22 and the insulating support 41 depending on machining accuracy of the film forming chamber 11, possibly leading to breakage. Since a larger value of the vertical distance "b" allows the raw material gas and reaction gas to infiltrate to the upper inert-gas supply port 53 side from the injector adhesion preventive member 22 outlet, an optimum value will be needed. In the apparatus for atomic layer deposition of the present invention, an upper limit thereof is preferably 3 mm.

Moreover, the injector adhesion preventive member 22 needs to be an insulator. Because, when it is a metal, electric discharge occurs between the plate electrode 12 and the injector adhesion preventive member 22. For example, by making the injector adhesion preventive member 22 with alumina ceramic, it is possible to suppress electric discharge.

Moreover, the injector adhesion preventive member 22 is, as shown in FIG. 2, preferably configured such that a tip end of the injector adhesion preventive member lower plate 22B is separated from an end section of the substrate 100 retained by the counter electrode 14 by a gap, and further a horizontal distance "c" of the gap is preferably not less than 0.1 mm and not more than 200 mm. A smaller value of the horizontal distance "c" makes it possible to suppress the raw material gas and reaction gas from infiltrating to the lower inert-gas supply port 54 side. When the horizontal distance "c" is excessively small, the injector adhesion preventive member 22 may possibly interfere with the substrate 100. However, in the film forming in which the substrate 100 has a mask thereon, space for placing the mask becomes necessary. Therefore, in the apparatus for atomic layer deposition of the present invention, the value of "c" is preferably 100 mm which can cope with the masking film forming.

Moreover, as shown in FIG. 2, the lower surface of the injector adhesion preventive member lower plate 22B of the injector adhesion preventive member 22 and the counter electrode 14 upper surface side have a gap therebetween, and further a vertical distance "d" of the gap is preferably not less than 0.1 mm and not more than 20 mm, and more preferably 3 mm. A smaller value of the vertical distance "d" makes it possible to suppress the raw material gas and the reaction gas from infiltrating to the lower inert-gas supply port 54 side. However, when the value of the vertical distance "d" is excessively small, the injector adhesion preventive member 22 and the counter electrode 14 may interfere with each other depending on machining accuracy of the film forming chamber 11, possibly causing breakage, and therefore an optimum value is needed. Moreover, a counter electrode adhesion preventive member 15 may be used on the counter electrode 14. In this case, the distance between the upper surface of the counter electrode adhesion preventive member 15 and the lower surface of the injector adhesion preventive member 22 will be "d".

Moreover, the injector adhesion preventive member 22 is, as shown in FIG. 2, preferably fixed at a point having a horizontal distance "e" of not less than 50 mm from the end surface of the plate electrode 12. Although, a fixing screw 23 is used for fixing in this example, since use of a metallic screw tends to cause abnormal electric discharge, it is necessary to keep a distance to the plate electrode 12. When a screw made of resin is used, although it is possible to suppress abnormal electric discharge, if it is exposed to plasma, the resin may be deformed, causing degassing, so that it is also necessary to keep a large distance to the plate electrode. Moreover, the raw material gas and the reaction gas will readily infiltrate into a screw hole, thus causing film adhesion and powder generation. Therefore, it is not preferable to place the screw at a position to be exposed to the raw material gas and the reaction gas. Note that the fixing method is not limited to use of a fixing screw.

Exactly the same as regarding the gas introducing section 20 applies to the exhaust section 30. It is preferable that the gas introducing section 20 and the exhaust section 30 are symmetrical. Therefore, it is desirable that the exhaust adhesion preventive member 32 also satisfies the above described conditions in the distances "a" to "e". In this case, the same conditions are presented with the injector adhesion preventive member 22 being replaced with the exhaust adhesion preventive member 32.

Figure 3:
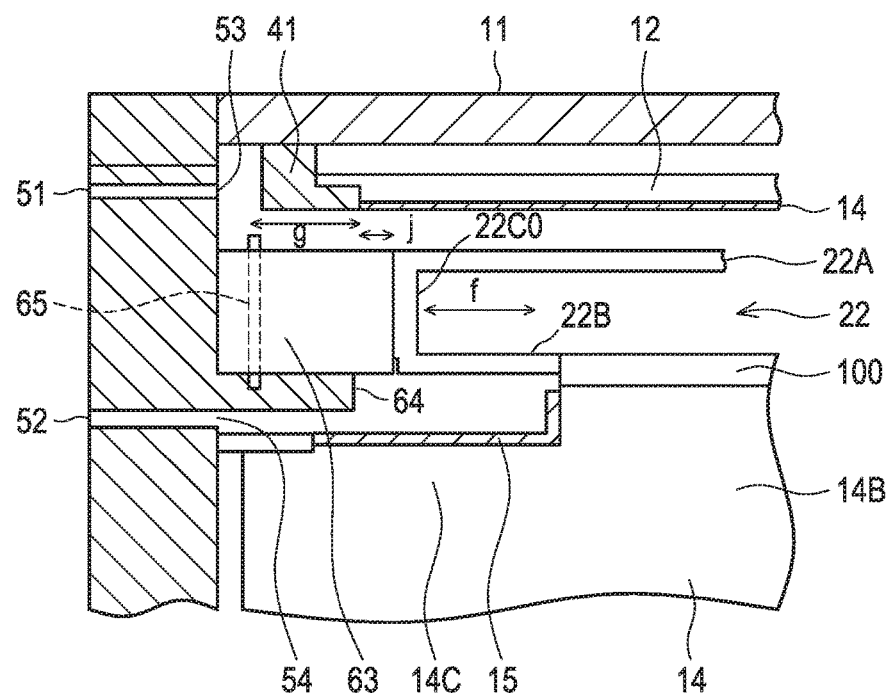
FIG. 3 is likewise an enlarged view of a periphery of a gas introducing section seen from the film forming chamber exhaust side.

FIG. 3 is an enlarged view of the periphery of a gas introducing section seen from the exhaust side of the film forming chamber. As shown in FIG. 3, a distance "f" between an opening section inner surface 22C0 of the injector adhesion preventive member 22 and an end section of the substrate 100 is preferably not less than 0.1 mm and not more than 200 mm. When the distance is small, since gas flow will be disturbed at a side wall, excellent film thickness and uniform film quality cannot be obtained; and contrary, when the distance is excessively large, the amount of the raw material to be consumed increases, thereby increasing running cost. Moreover, in the film forming in which a mask is present on a glass substrate, a space for containing the mask will be needed. Therefore, a value of the distance "f" is preferably 100 mm which can cope with masking film forming. Exactly the same as regarding the gas introducing section 20 for introducing the raw material gas, the reaction gas, and the purge gas applies to the exhaust section 30 as well. It is preferable that the introducing section 20 and the exhaust section 30 are symmetrical. Therefore, it is desirable that the value of distance "f" is satisfied in the exhaust section 30 as well.

In the relation between a sideward end of the plate electrode 12 and an inner side surface of the film forming chamber adhesion preventive member 63, it is desirable that the inner side surface of the film forming chamber adhesion preventive member 63 is located inwardly to the sideward end of the plate electrode 12, and the horizontal distance "j" in that case is preferably not less than 0.1 mm and not more than 200 mm. A larger value of "j" makes it possible to suppress the raw material gas and the reaction gas from infiltrating to the film forming chamber adhesion preventive member 63 side. However, a larger value leads to a larger size of the film forming chamber, an optimum value is needed. In the present apparatus for atomic layer deposition, it is preferably 20 mm.

Moreover, fixing of the film forming chamber adhesion preventive member 63 is preferably performed at a point having a horizontal distance "g" of not less than 50 mm from an end surface of the plate electrode 12 as shown in FIG. 3, for the same reason as that for the fixing screw 23.

Figure 4:
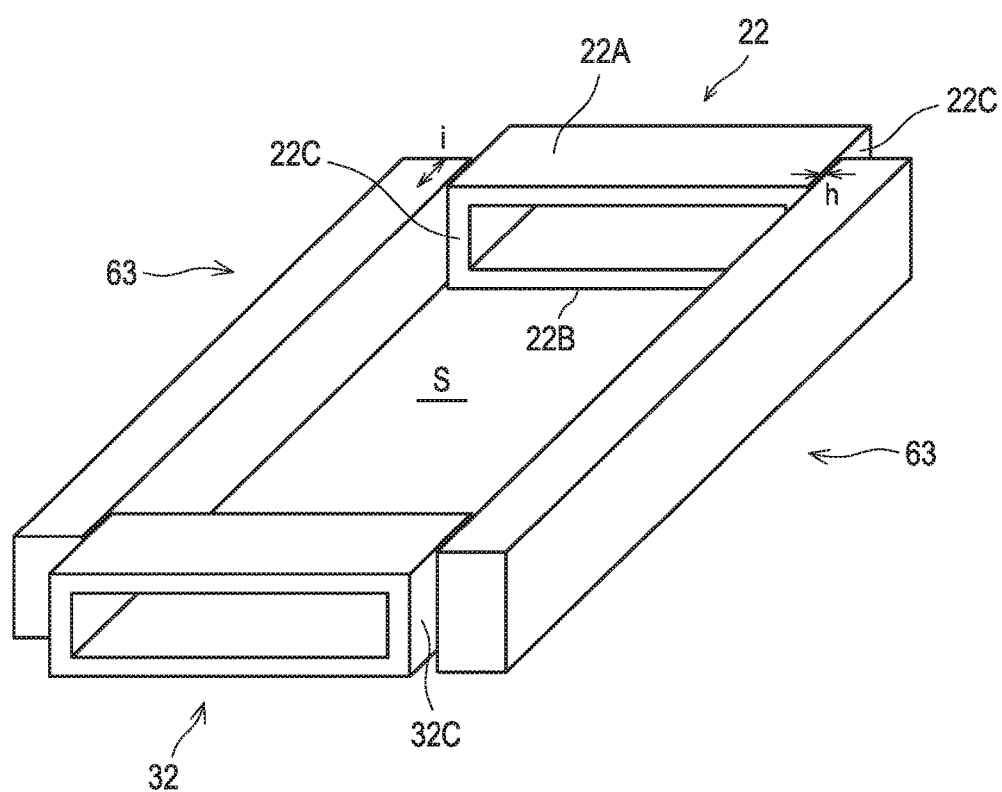
FIG. 4 is likewise a perspective view showing the deposition of adhesion preventive members within the film forming chamber.

Further, FIG. 4 is a layout diagram of adhesion preventive members within the film forming chamber. It is preferable that the injector adhesion preventive member 22 and the exhaust adhesion preventive member 32 are surrounded by the film forming chamber adhesion preventive member 63 as shown in FIG. 4. A horizontal distance "h" between each of an outer surface of the injector adhesion preventive member 22 and an outer surface of the exhaust adhesion preventive member 32, and an inner surface of the film forming chamber adhesion preventive member 63 is preferably not less than 0.1 mm and not more than 20 mm, and further preferably 1 mm. A smaller value of "h" makes it possible to suppress the raw material gas and reaction gas from infiltrating to the film forming chamber 11 inner wall side. However, when the value is excessively small, the injector adhesion preventive member 22 and the film forming chamber adhesion preventive member 63 undergo thermal expansion, leading to interference and breakage, which is not preferable.

Moreover, an overlapping distance "i" in the flow direction of gas between the injector adhesion preventive member 22 and the film forming chamber adhesion preventive member 63 is preferably not less than 0.1 mm and not more than 200 mm, and further the distance from the overlapping section to the fixing screw 23 is preferably 120 mm. A larger value of the distance "i" makes it possible to suppress the raw material gas and the reaction gas from infiltrating to the film forming chamber 11 inner wall side.

Exactly the same as regarding the injector adhesion preventive member 22 applies to the exhaust adhesion preventive member 33 as well. Therefore, it is desirable that distances "f" to "j" satisfy each of the above described conditions, in the exhaust adhesion preventive member 33 as well. In this case, the same conditions are presented with the injector adhesion preventive member 22 being replaced with the exhaust adhesion preventive member 32.

Figure 5:
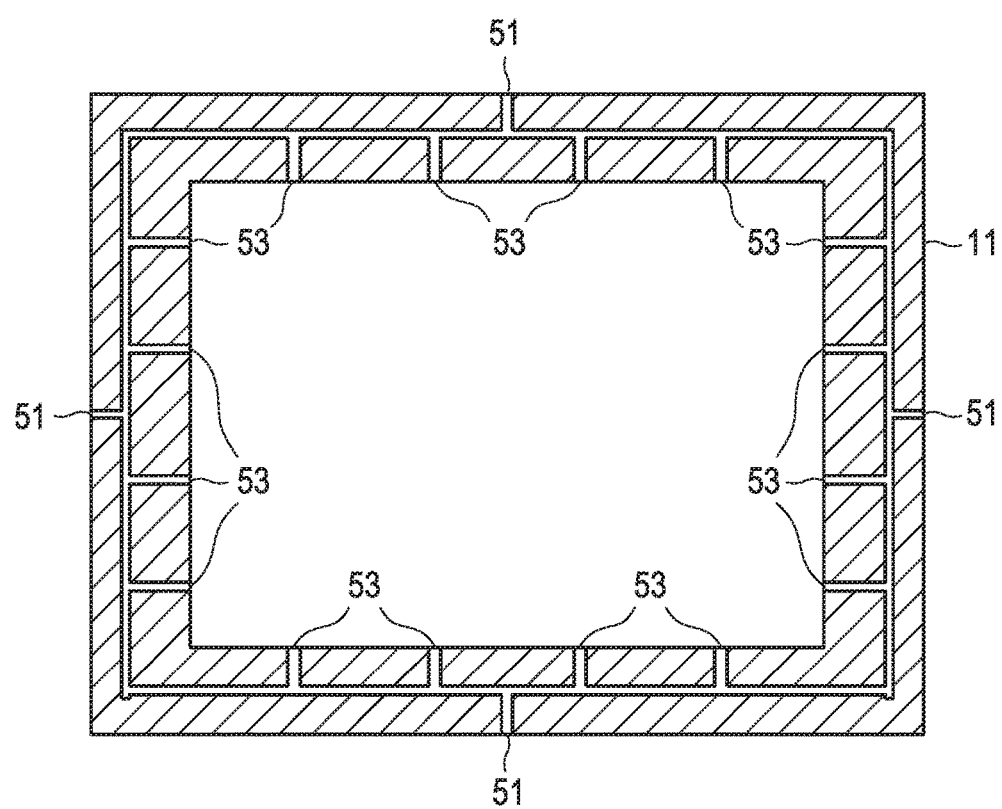
FIG. 5 is likewise a schematic diagram of an upper inert-gas supply section and an upper inert-gas supply port when the film forming chamber is seen from an upper surface.

FIG. 5 is a schematic diagram showing an upper inert-gas supply section 51 and an upper inert-gas supply port 53 when the film forming chamber is seen from an upper surface. It is preferable to provide a through hole in the film forming chamber 11 and supply the gas in a shower from the entire circumference of the film forming chamber 11. Although the upper inert-gas supply section 51 is provided in four places in FIG. 5, it may be provided in one place. The upper inert-gas supply section 51 is connected to the upper inert-gas supply port 53 by a shower head structure.

Moreover, the lower inert-gas supply section 52 may have a similar structure to that of the upper inert-gas supply section 51, and further may have a structure in which one supply section is provided, and then branched to the upper inert-gas supply ports and the lower inert-gas supply section ports. A shower-hole diameter at each supply port is preferably within a range of 1 to 3 mm, and may be about 1 mm. A shower-hole pitch is preferably 10 mm to 200 mm. The shower may be made by providing through holes in the film forming chamber 11, or a shower plate is separately made and may be mounted to the film forming chamber 11.

Next, the processing procedure in the apparatus for plasma atomic layer deposition 10 will be described.

Figure 6:
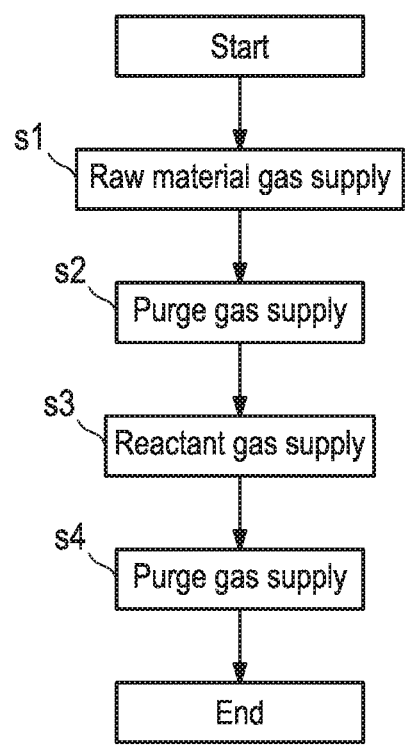
FIG. 6 is likewise a flowchart showing one example of the atomic layer deposition method.

FIG. 6 is a flow chart showing one example of the atomic layer deposition method of the present embodiment. FIGS. 7A to 7D are each a diagram showing steps in which a thin film is formed on the substrate 100.

Figure 7A:
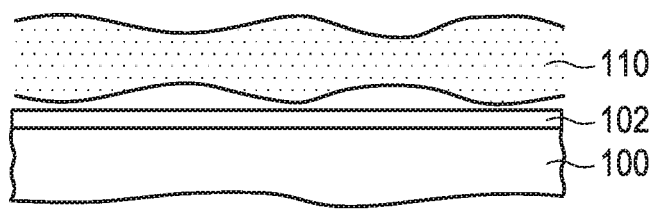
FIGS. 7A, 7B, 7C, and 7D are likewise diagrams showing process steps in which a thin film is formed on a substrate.

First, the raw material gas supply section supplies a raw material gas into the film forming chamber 11 (step s1). Specifically, it supplies the raw material gas to the gas introducing section 20 (step s1). The raw material gas is supplied into the film forming chamber 11. The raw material gas is supplied into the film forming chamber 11 for 0.1 seconds, for example. As shown in FIG. 7A, by step s1, a raw material gas 110 is supplied into the film forming chamber 11, and the raw material gas 110 is adsorbed onto the substrate 100, forming an adsorption layer 102.

Moreover, in step s1, inert gas is supplied to an inner surface of the injector 21 and an outer surface of the injector adhesion preventive member 22. Further, in the exhaust section 30, inert gas is also supplied to the exhaust flange 31 and the exhaust adhesion preventive member 32. Furthermore, inert gas is supplied into the film forming chamber also from the upper inert-gas supply section 51 and the lower inert-gas supply section 52.

In the present embodiment, by supplying inert gas not only in step s1, but constantly including in steps s2 to s4 when the raw material gas is supplied, it is possible to suppress the raw material gas from penetrating into:

a gap between the film forming chamber 11 and the injector 20, a gap between the film forming chamber 11 and the injector adhesion preventive member 22, a gap between the injector adhesion preventive member 22 and the insulating support 41, a gap between the injector adhesion preventive member 22 and the counter electrode adhesion preventive member 15, a gap between the film forming chamber 11 and the exhaust flange 31, a gap between the film forming chamber 11 and the exhaust adhesion preventive member 32, a gap between the exhaust adhesion preventive member 32 and the insulating support 41, a gap between the exhaust adhesion preventive member 32 and the counter electrode adhesion preventive member 15, a gap between the film forming chamber adhesion preventive member and the insulating support 41, and a gap between the film forming chamber adhesion preventive member and the counter electrode adhesion preventive member 15.

Next, supply of the raw material gas is stopped, and a purge gas is supplied at the gas introducing section (step s2). The purge gas is supplied into the film forming chamber 11. The raw material gas is discharged to the outside of the film forming chamber 11 from the exhaust section 30.

Figure 7B:
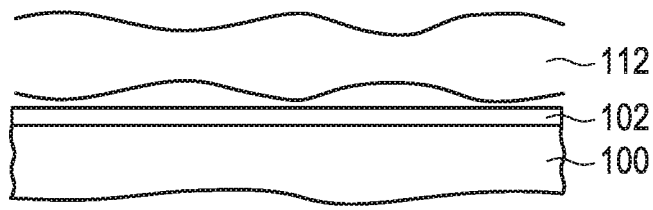

The purge gas is supplied into the film forming chamber 11 for, for example, 0.1 second. The exhaust section 30 exhausts a raw material gas 110 and a purge gas 112 within the film forming chamber 11. The exhaust section 30 exhausts the raw material gas 110 and the purge gas 112 within the film forming chamber 11 for, for example, 2 seconds. As shown in FIG. 7B, the purge gas 112 is supplied into the film forming chamber 11 by step s2, and the raw material gas 110 which has not adsorbed onto the substrate 100 is purged from the film forming chamber 11.

Figure 7C:
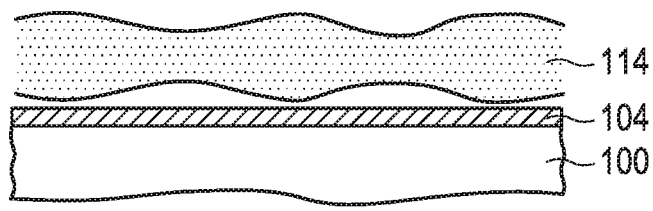

Next, a reaction gas is supplied into the film forming chamber (step s3). Specifically, the reaction gas is supplied through the gas introducing section 20 (step s3). The reaction gas is supplied into the film forming chamber 11 through a passage of the gas introducing section 20. The reaction gas is supplied into the film forming chamber 11 for, for example, 1 second. As shown in FIG. 7C, a reaction gas 114 is supplied into the film forming chamber 11 by step s3.

Further, in step s3 as well, inert gas is supplied at the inner surface of the injector 21, the outer surface of the injector adhesion preventive member 22, and the exhaust section 30. Therefore, in step s3, by supplying inert gas when the reaction gas is supplied into the film forming chamber 11, it is possible to suppress the reaction gas from penetrating into:

a gap between the film forming chamber 11 and the injector 20, a gap between the film forming chamber 11 and the injector adhesion preventive member 22, a gap between the injector adhesion preventive member 22 and the insulating support 41, a gap between the injector adhesion preventive member 22 and the counter electrode adhesion preventive member 15, a gap between the film forming chamber 11 and the exhaust flange 31, a gap between the film forming chamber 11 and the exhaust adhesion preventive member 32, a gap between the exhaust adhesion preventive member 32 and the insulating support 41, a gap between the exhaust adhesion preventive member 32 and the counter electrode adhesion preventive member 15, a gap between the film forming chamber adhesion preventive member and the insulating support 41, and a gap between the film forming chamber adhesion preventive member and the counter electrode adhesion preventive member 15.

Figure 7D:
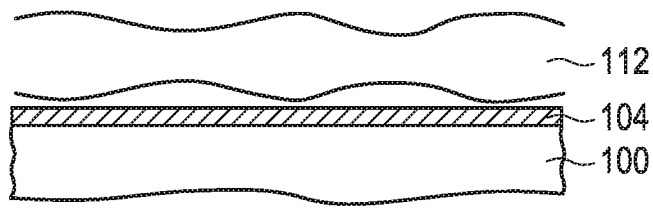

Next, the supply of the reaction gas is stopped, and a purge gas is supplied at the gas introducing section (step s4). The purge gas is supplied into the film forming chamber 11. The purge gas is discharged from the exhaust section 30 to the outside of the film forming chamber 11. The purge gas is supplied into the film forming chamber 11 for, for example, 0.1 second. The exhaust section 30 exhausts the reaction gas 114 and the purge gas 112 within the film forming chamber 11. As shown in FIG. 7D, by step s4, the purge gas 112 is supplied into the film forming chamber 11, and the reaction gas 114 is purged from the film forming chamber 11.

Through steps s1 to s4 described so far, a thin-film layer 104 of one atomic layer is formed on the substrate 100. Hereinafter, by repeating steps s1 to s4 for predetermined times, it is possible to form a thin-film layer 104 having a desired film thickness.

Since, in the apparatus for plasma atomic layer deposition 10 of the present embodiment, the inert-gas flows on the inner surface of the injector 21 and the outer surface of the injector adhesion preventive member 22, it is possible to suppress the raw material gas and the reaction gas from penetrating into the gap between the film forming chamber 11 and the injector 21. For that reason, it is possible to suppress a thin film from adhering in a gap between the film forming chamber 11 and the injector 21. Moreover, the exhaust section 30 is also prevented from adhesion of thin film in a similar fashion.

Further, inert gas is also supplied from the upper inert-gas supply section 51 and the lower inert-gas supply section 52, making it possible to suppress film adhesion within the film forming chamber.

Moreover, for example, an alumina film, which is formed by using TMA as the raw material gas, and $O_3$ as the reaction gas, can be subjected to gas etching by $BCl_3$ gas. To subject an alumina film to gas etching with $BCl_3$ gas, for example, it needs to be heated to a high temperature of about 500° C.

The inner wall of the film forming chamber 11 located in the vicinity of a stage heater 14A can be heated by the stage heater 14A to a high temperature of about 500° C. For that reason, a thin film which has adhered to the inner wall of the film forming chamber 11 located in the vicinity of the stage heater 14A can be removed by gas etching.

As so far described, since, according to the present embodiment, it is possible to suppress a thin film from adhering to the inner wall of the film forming chamber 11 and to remove the film which has adhered to the inner wall by gas etching, it is possible to reduce the frequency of cleaning by wet etching.

Example 1

By using the apparatus for plasma atomic layer deposition shown in the embodiment, an AlON thin film was formed on G2 glass substrate of 370 mm×470 mm. Various values of the present apparatus for atomic layer deposition were as follows:

a: 20 mm,
b: 3 mm,
c: 100 mm,
d: 3 mm,
e: 100 mm,
f: 100 mm,
g: 100 mm,
h: 1 mm,
i: 120 mm,
j: 20 mm,

Shower-hole diameter: 1 mm, and
Shower pitch: 100 mm.

TMA (trimethyl aluminum) was used as the liquid raw material (Al source), and Oxygen plasma and nitrogen plasma were used as the reaction gas. Film forming was carried out according to the sequence shown in FIG. 6. The pressure within the film forming chamber was 100 Pa, and 1000 sccm of nitrogen was supplied from the upper inert-gas supply section and the lower inert-gas supply section so as to be supplied constantly during the film forming sequence.

After film forming of 20 μm was performed, portions where film adhesion was observed within the film forming space were only the injector, the injector adhesion preventive member, the exhaust adhesion preventive member, the plate electrode adhesion preventive member, two film forming chamber adhesion preventive members, and the counter electrode adhesion preventive member; and generation of powder was not observed. Objects to be maintained included only the above described 6 items of adhesion preventive member, and 20 pieces of screws used in the upper electrode adhesion preventive member, and thus maintenability was remarkably improved.

Although the present invention has been described based on the above described embodiment and Example so far, appropriate modifications may be made to the above described contents as long as they do not depart from the scope of the present invention.

The present application claims priority to Japanese Patent Application No. 2015-106858, filed on May 26, 2015 in Japan, the entirety of which is incorporated herein by reference.

REFERENCE SIGNS LIST

10 Apparatus for plasma atomic layer deposition
11 Film forming chamber
11A Gas-introducing opening section
11B Exhaust opening section
12 Plate electrode
13 Plate electrode adhesion preventive member
14 Counter electrode
14A Stage heater
14B Counter-electrode retaining section
14C Counter-electrode peripheral edge section
15 Counter electrode adhesion preventive member
16 High-frequency power supply
20 Gas introducing section
21 Injector
22 Injector adhesion preventive member
22A Injector adhesion preventive member upper plate
22B Injector adhesion preventive member lower plate
22C Injector adhesion preventive member side plate
23 Fixing screw
30 Exhaust section
31 Exhaust flange
32 Exhaust adhesion preventive member
41 Insulating support
51 Upper inert-gas supply section
52 Lower inert-gas supply section
53 Upper inert-gas supply port
54 Lower inert-gas supply port
63 Film forming chamber adhesion preventive member
64 Projecting wall
65 Fixing screw
100 Substrate
104 Thin film layer
110 Raw material gas
112 Purge gas
114 Reaction gas

The invention claimed is:

1. An apparatus for plasma atomic layer deposition for forming a thin film on a substrate, the apparatus comprising:
a film forming chamber;
a plate electrode provided so as to face a substrate retained in the film forming chamber;
a counter electrode retaining the substrate within the film forming chamber;
a gas-introducing opening section provided in one side wall section of the film forming chamber; and an exhaust opening section provided in the other side wall section, which faces the one side wall section, of the film forming chamber, wherein
the apparatus for plasma atomic layer deposition further comprises:
an insulating injector adhesion preventive member which is mountable to the gas-introducing opening section from inside the film forming chamber, and is disposed in a tubular shape so as to surround an opening of the gas-introducing opening section;
an insulating exhaust adhesion preventive member which is mountable to the exhaust opening section from inside the film forming chamber, and is disposed in a tubular shape so as to surround an opening of the exhaust opening section; and
an insulating film forming chamber adhesion preventive member which is mountable to an inner wall side of the film forming chamber, wherein:
the injector adhesion preventive member is separated from each of the plate electrode and the counter electrode side by a gap, and is configured such that its tip end is located inside with reference to the plate electrode end on the gas-introducing opening section side,
the exhaust adhesion preventive member is separated from each of the plate electrode and the counter electrode side by a gap, and is configured such that its tip end is located inside with reference to the plate electrode end on the exhaust opening section side, and
the film forming chamber adhesion preventive member is located at least on each side of the injector adhesion preventive member and the exhaust adhesion preventive member so as to be separated from each of the plate electrode and the counter electrode side by a gap; and
the apparatus for plasma atomic layer deposition further comprises:
an upper inert-gas supply port that purges inert gas toward inside the film forming chamber from the gap between the plate electrode and the film forming chamber adhesion preventive member;
a lower inert-gas supply port that purges inert gas toward inside the film forming chamber from the gap between the counter electrode and each of the injector adhesion preventive member, the exhaust adhesion preventive member, and the film forming chamber adhesion preventive member;
an upper inert-gas supply section to be connected to the upper inert-gas supply port; and
a lower inert-gas supply section to be connected to the lower inert-gas supply port.

2. The apparatus for plasma atomic layer deposition according to claim 1, wherein:

the injector adhesion preventive member extends such that its tip end position is located in a range of not less than 0.1 mm to not more than 200 mm from the plate electrode end toward the plate electrode center, with reference to the plate electrode end on the gas-introducing opening section side, and the exhaust adhesion preventive member extends such that its tip end position is located in a range of not less than 0.1 mm to not more than 200 mm from the plate electrode end toward the plate electrode center, with reference to the plate electrode end on the exhaust opening section side.

3. The apparatus for plasma atomic layer deposition according to claim 1, wherein:

a side end section of a tubular opening section by the injector adhesion preventive member has a distance of not less than 0.1 mm and not more than 200 mm outwardly from the end section on the sideward side of the substrate retained by the counter electrode, and a side end section of a tubular opening section by the exhaust adhesion preventive member has a distance of not less than 0.1 mm and not more than 200 mm outwardly from the end section on the sideward side of the substrate retained by the counter electrode.

4. The apparatus for plasma atomic layer deposition according to claim 1, wherein the film forming chamber adhesion preventive member has a size to cover a vertical width of a side section of the injector adhesion preventive member and a side section of the exhaust adhesion preventive member, and an inner side surface of the film forming chamber adhesion preventive member and an outer side surface of the injector adhesion preventive member have a gap of not less than 0.1 mm and not more than 20 mm in horizontal distance therebetween, and an inner side surface of the film forming chamber adhesion preventive member and an outer side surface of the exhaust adhesion preventive member have a gap of not less than 0.1 mm and not more than 20 mm in horizontal distance therebetween.

5. The apparatus for plasma atomic layer deposition according to claim 1, wherein:

the film forming chamber adhesion preventive member and a side section of the injector adhesion preventive member have an overlap of not less than 0.1 mm and not more than 200 mm in a flow direction of gas between the gas-introducing opening section and the exhaust opening section, and the film forming chamber adhesion preventive member and a side section of the exhaust adhesion preventive member have an overlap of not less than 0.1 mm and not more than 200 mm in a flow direction of gas between the gas-introducing opening section and the exhaust opening section.

6. The apparatus for plasma atomic layer deposition according to claim 1, wherein:

the injector adhesion preventive member is configured such that its sideward outer surface is located inside at a distance of not less than 0.1 mm and not more than 200 mm with reference to a side end of the plate electrode, and the exhaust adhesion preventive member is configured such that its sideward outer surface is located inside at a distance of not less than 0.1 mm and not more than 200 mm with reference to a side end of the plate electrode end.

7. The apparatus for plasma atomic layer deposition according to claim 1, wherein the film forming chamber adhesion preventive member, the injector adhesion preventive member, and the exhaust adhesion preventive member are mounted and fixed to the film forming chamber so as to each have a fixing end section against the film forming chamber at a position of a distance of not less than 50 mm apart from a proximal plate electrode end.

8. The apparatus for plasma atomic layer deposition according to claim 1, wherein the film forming chamber adhesion preventive member has a length extending over the injector adhesion preventive member and the exhaust adhesion preventive member.

9. The apparatus for plasma atomic layer deposition according to claim 1, wherein the upper inert-gas supply section and the lower inert-gas supply section are respectively connected to the upper inert-gas supply port and the lower inert-gas supply port by a shower head structure.

10. The apparatus for plasma atomic layer deposition according to claim 1, wherein each of an upper surface of the injector adhesion preventive member and an upper surface of the exhaust adhesion preventive member is separated from a lower surface of the plate electrode side by a gap of not less than 0.1 mm and not more than 20 mm in vertical distance.

11. The apparatus for plasma atomic layer deposition according to claim 1, wherein each of the injector adhesion preventive member and the exhaust adhesion preventive member is separated from a proximal end section of the substrate retained by the counter electrode by a gap of not less than 0.1 mm and not more than 200 mm in horizontal distance, in a flow direction of gas between the gas introducing section and the exhaust section.

12. The apparatus for plasma atomic layer deposition according to claim 1, wherein each of a lower surface of the injector adhesion preventive member and a lower surface of the exhaust adhesion preventive member is separated from an upper surface of the counter electrode side by a gap of not less than 0.1 mm and not more than 20 mm in vertical distance.

13. The apparatus for plasma atomic layer deposition according to claim 1, wherein the counter electrode includes a counter electrode retaining section which has a retaining surface for retaining the substrate, and a counter-electrode peripheral edge section which is present around the counter electrode retaining section, and has a height lower than that of the counter electrode retaining surface.

* * * * *